(12) United States Patent
Jing et al.

(10) Patent No.: US 9,524,964 B2
(45) Date of Patent: Dec. 20, 2016

(54) CAPACITOR STRUCTURE IN AN INTEGRATED CIRCUIT

(71) Applicant: Xilinx, Inc., San Jose, CA (US)

(72) Inventors: Jing Jing, San Jose, CA (US); Shuxian Wu, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/460,292

(22) Filed: Aug. 14, 2014

(65) Prior Publication Data
US 2016/0049393 A1 Feb. 18, 2016

(51) Int. Cl.
H01L 21/02 (2006.01)
H01L 27/08 (2006.01)
H01L 49/02 (2006.01)
H01L 23/522 (2006.01)

(52) U.S. Cl.
CPC ....... H01L 27/0805 (2013.01); H01L 23/5223 (2013.01); H01L 28/60 (2013.01)

(58) Field of Classification Search
CPC .................................................. H01L 23/5223
USPC ................ 257/532, 306, 499, 528, E29.001, 257/E29.002; 438/38, 171, 190, 210, 438/238–253, 329, 379, 387, 444, 901, 438/381
See application file for complete search history.

(56) References Cited

U.S. PATENT DOCUMENTS

| | | |
|---|---|---|
| 1,899,176 A | 2/1933 | Bailey |
| 3,593,319 A | 7/1971 | Barber |
| 4,156,249 A | 5/1979 | Koo |
| 4,249,196 A | 2/1981 | Durney et al. |
| 4,409,608 A | 10/1983 | Yoder |
| 4,427,457 A | 1/1984 | Carlson et al. |
| 4,470,096 A | 9/1984 | Guertin |
| 4,470,099 A | 9/1984 | Sawairi |
| 4,571,543 A | 2/1986 | Raymond et al. |
| 4,639,686 A | 1/1987 | Beckenbach et al. |
| 4,700,457 A | 10/1987 | Matsukawa |
| 4,731,696 A | 3/1988 | Himes et al. |

(Continued)

FOREIGN PATENT DOCUMENTS

| | | |
|---|---|---|
| DE | 25 48 563 A1 | 5/1977 |
| DE | 100 46 910 A1 | 10/2001 |
| DE | 10145 462 A1 | 4/2003 |
| GB | 1 149 569 | 4/1969 |
| GB | 1 469 944 A | 4/1977 |
| JP | 57-106804 | 7/1982 |
| JP | 58-051552 | 3/1983 |

(Continued)

OTHER PUBLICATIONS

Amintoosi et al., "Using pattern matching for tiling and packing problems" European Journal of Operational Research, Amsterdam, NL, vol. 83, No. 3, Jul. 10, 2007, pp. 950-960.

(Continued)

*Primary Examiner* — Cuong Q Nguyen
*Assistant Examiner* — Tong-Ho Kim
(74) *Attorney, Agent, or Firm* — Keith Taboada; Robert M. Brush (57) ABSTRACT

In an example, a capacitor in an integrated circuit (IC), includes: a first finger capacitor formed in at least one layer of the IC having a first bus and a second bus; a second finger capacitor formed in the at least one layer of the IC having a first bus and a second bus, where a longitudinal edge of the second bus of the second finger capacitor is adjacent a longitudinal edge of the first bus of the first finger capacitor and separated by a dielectric gap; and a first metal segment formed on a first layer above the at least one layer, the first metal segment being electrically coupled to the first bus of the first finger capacitor and increasing a width and a height of the first bus of the first finger capacitor.

14 Claims, 9 Drawing Sheets

(56) References Cited

U.S. PATENT DOCUMENTS

| | | |
|---|---|---|
| 4,827,323 A | 5/1989 | Tigelaar et al. |
| 4,831,431 A | 5/1989 | Hanlon |
| 4,878,151 A | 10/1989 | Gallichio |
| 4,914,546 A | 4/1990 | Alter |
| 4,937,649 A | 6/1990 | Shiba et al. |
| 4,994,688 A | 2/1991 | Horiguchi et al. |
| 5,005,103 A | 4/1991 | Kwon et al. |
| 5,021,920 A | 6/1991 | Smith |
| 5,077,225 A | 12/1991 | Lee |
| 5,083,184 A | 1/1992 | Eguchi |
| 5,089,878 A | 2/1992 | Lee |
| 5,117,114 A | 5/1992 | Street et al. |
| 5,119,169 A | 6/1992 | Kozono et al. |
| 5,142,639 A | 8/1992 | Kohyama et al. |
| 5,155,658 A | 10/1992 | Inam et al. |
| 5,166,858 A | 11/1992 | Frake et al. |
| 5,172,299 A | 12/1992 | Yamada et al. |
| 5,177,410 A | 1/1993 | Hashiguchi et al. |
| 5,189,594 A | 2/1993 | Hoshiba |
| 5,208,725 A | 5/1993 | Akcasu |
| 5,275,974 A | 1/1994 | Ellul et al. |
| 5,583,359 A | 12/1996 | Ng et al. |
| 5,712,813 A | 1/1998 | Zhang |
| 5,868,388 A | 2/1999 | Wood et al. |
| 5,939,766 A | 8/1999 | Stolmeijer et al. |
| 6,037,621 A | 3/2000 | Wilson |
| 6,064,108 A | 5/2000 | Martinez |
| 6,066,537 A | 5/2000 | Poh |
| 6,297,524 B1 | 10/2001 | Vathulya et al. |
| 6,303,456 B1 | 10/2001 | Pricer et al. |
| 6,303,457 B1 | 10/2001 | Christensen et al. |
| 6,383,858 B1 | 5/2002 | Gupta et al. |
| 6,385,033 B1 | 5/2002 | Javanifard et al. |
| 6,410,954 B1 | 6/2002 | Sowlati et al. |
| 6,417,556 B1 | 7/2002 | Long et al. |
| 6,437,431 B1 | 8/2002 | Mbouombouo et al. |
| 6,542,351 B1 | 4/2003 | Kwang |
| 6,548,400 B2 | 4/2003 | Brennan et al. |
| 6,570,210 B1 | 5/2003 | Sowlati et al. |
| 6,597,562 B1 | 7/2003 | Hu et al. |
| 6,625,006 B1 | 9/2003 | Aram et al. |
| 6,653,681 B2 | 11/2003 | Appel |
| 6,661,079 B1 | 12/2003 | Bikulcius |
| 6,690,570 B2 | 2/2004 | Hajimiri et al. |
| 6,737,698 B1 | 5/2004 | Paul et al. |
| 6,747,307 B1 | 6/2004 | Vathulya et al. |
| 6,765,778 B1 | 7/2004 | Du et al. |
| 6,819,542 B2 | 11/2004 | Tsai et al. |
| 6,822,312 B2 | 11/2004 | Sowlati et al. |
| 6,880,134 B2 | 4/2005 | Drennan |
| 6,882,015 B2 | 4/2005 | Bernstein et al. |
| 6,897,505 B2 | 5/2005 | Aton |
| 6,903,918 B1 | 6/2005 | Brennan |
| 6,927,125 B2 | 8/2005 | Jones et al. |
| 6,933,551 B1 | 8/2005 | Stribley et al. |
| 6,933,869 B2 | 8/2005 | Starr et al. |
| 6,949,781 B2 | 9/2005 | Chang et al. |
| 6,963,122 B1 | 11/2005 | Soenen et al. |
| 6,972,463 B2 | 12/2005 | Cheng |
| 6,974,744 B1 | 12/2005 | Aram et al. |
| 7,009,832 B1 | 3/2006 | Chen et al. |
| 7,013,436 B1 | 3/2006 | Morton et al. |
| 7,027,287 B2 | 4/2006 | Georgakos |
| 7,038,296 B2 | 5/2006 | Laws |
| 7,050,290 B2 | 5/2006 | Tang et al. |
| 7,116,544 B1 | 10/2006 | Sutardja |
| 7,154,734 B2 | 12/2006 | Schultz et al. |
| 7,161,228 B1 | 1/2007 | Pettit |
| 7,170,178 B2 | 1/2007 | Bely et al. |
| 7,193,263 B2 | 3/2007 | Barth |
| 7,195,971 B2 | 3/2007 | Bernstein et al. |
| 7,202,548 B2 | 4/2007 | Lee |
| 7,205,854 B2 | 4/2007 | Liu |
| 7,238,981 B2 | 7/2007 | Marotta |
| 7,259,945 B2 | 8/2007 | Cleveland |
| 7,259,956 B2 | 8/2007 | Fong et al. |
| 7,271,465 B2 | 9/2007 | Jessie et al. |
| 7,274,085 B1 | 9/2007 | Hsu et al. |
| 7,286,071 B1 | 10/2007 | Hsueh et al. |
| 7,298,001 B1 | 11/2007 | Liu et al. |
| 7,348,624 B2 | 3/2008 | Sakaguchi et al. |
| 7,394,274 B2 | 7/2008 | Muniandy et al. |
| 7,439,570 B2 | 10/2008 | Anthony |
| 7,485,914 B2 | 2/2009 | Huang et al. |
| 7,564,264 B1 | 7/2009 | Morrison et al. |
| 7,564,675 B2 | 7/2009 | Chen et al. |
| 7,663,233 B2 | 2/2010 | Lim |
| 7,768,054 B2 | 8/2010 | Benetik et al. |
| 7,944,732 B2 | 5/2011 | de Jong et al. |
| 7,956,438 B2 | 6/2011 | Quinn |
| 7,994,609 B2 | 8/2011 | Quinn |
| 7,994,610 B1* | 8/2011 | Quinn .......................... 257/532 |
| 8,207,592 B2 | 6/2012 | Quinn |
| 8,362,589 B2 | 1/2013 | Quinn |
| 8,653,844 B2 | 2/2014 | Sadoughi et al. |
| 8,941,974 B2 | 1/2015 | Wu et al. |
| 2003/0132475 A1 | 7/2003 | Kanamori |
| 2003/0183884 A1 | 10/2003 | Miyazawa |
| 2005/0077581 A1 | 4/2005 | Chang et al. |
| 2005/0135042 A1 | 6/2005 | Chiu-Kit Fong et al. |
| 2005/0145987 A1 | 7/2005 | Okuda et al. |
| 2005/0161725 A1 | 7/2005 | Da Dalt |
| 2006/0203424 A1 | 9/2006 | Chen et al. |
| 2007/0057344 A1* | 3/2007 | Lee ..................... H01L 23/5223 257/532 |
| 2007/0096720 A1 | 5/2007 | Clements et al. |
| 2007/0181973 A1 | 8/2007 | Hung et al. |
| 2007/0190760 A1 | 8/2007 | Coolbaugh et al. |
| 2007/0278551 A1 | 12/2007 | Anthony |
| 2007/0296013 A1 | 12/2007 | Chang et al. |
| 2008/0123245 A1* | 5/2008 | Lee et al. ...................... 361/304 |
| 2008/0128857 A1 | 6/2008 | Bi |
| 2008/0239619 A1 | 10/2008 | Okamoto et al. |
| 2009/0057826 A1 | 3/2009 | Kim et al. |
| 2009/0230507 A1* | 9/2009 | Riess ................... H01L 23/5223 257/532 |
| 2010/0125989 A1 | 5/2010 | Huang et al. |
| 2010/0127351 A1 | 5/2010 | Quinn |
| 2012/0212877 A1 | 8/2012 | Lu |
| 2012/0229203 A1 | 9/2012 | Sadoughi et al. |
| 2015/0145615 A1 | 5/2015 | Jing et al. |

FOREIGN PATENT DOCUMENTS

| | | |
|---|---|---|
| JP | 59-91718 | 6/1984 |
| JP | 61-259560 A | 11/1986 |
| JP | 61-263251 A | 11/1986 |
| JP | 63-070550 | 3/1988 |
| JP | 01084616 A | 3/1989 |
| JP | 01096943 A | 4/1989 |
| JP | 01-313917 | 12/1989 |
| JP | 01298322 A | 12/1989 |
| JP | 02231755 A | 9/1990 |
| JP | 02-268439 | 11/1990 |
| JP | 02-307275 | 12/1990 |
| JP | 03-008360 | 1/1991 |
| JP | 03-071612 | 3/1991 |
| JP | 04-268756 | 9/1992 |
| JP | 07-283076 | 10/1995 |
| JP | 09-199973 A | 7/1997 |
| JP | 11-274887 A | 10/1999 |
| JP | 2001-267503 A | 9/2001 |
| WO | WO 03/090280 | 10/2003 |

OTHER PUBLICATIONS

Aparicio and Hajimiri, "Capacity Limits and Matching Properties of Integrated Capacitors", IEEE J. Solid-State circuits, vol. 37, No. 3, pp. 384-393, Mar. 2002.

Chan et al., "Analysis of MMIC Structures Using an Efficient Iterative Approach", IEEE Transactions on Microwave Theory and Techniques, vol. 36, No. 1, Jan. 1988, pp. 96-105.

(56) References Cited

OTHER PUBLICATIONS

Fukuda, H. et al., "Enumeration of Polyominoes, Polyiamonds and Polyhexes for Isohedral Tilings with Rotational Symmetry", Jun. 11, 2007, Computational Geometry and Graph Theory, Springer Berlin Heidelberg, Berlin Heidelberg, pp. 68-78.

Imamura et al., "Bending-Comb capacitor with a Small Parasitic Inductance", 2002 Symposium on VLSI Circuits Digest of Technical Papers, IEEE 2002, Jun. 13-15, 2002, pp. 22-25.

Jacobsen, Jesper, Lykke "Tetromino tilings and the Tutte polynomial", Journal of Physics A: Mathematical and Theoretical, vol. 40, No. 7, Feb. 16, 2007. pp. 1439-1446.

Rajagopalan et al., "Optimization of Metal-Metal Comb-Capacitors for RF Applications", Wireless Design & Development, Mar. 4, 2001, pp. 1-4.

Rhoads et al., "Planar tilings by polyominoes, polyhexes and polyiamonds", Journal of Computational and Applied Mathematics, Amsterdam, NL, vol. 174, No. 2, Feb. 15, 2005, pp. 329-353.

Samavati, H. et al., "Fractal Capacitor", IEEE Journal of Solid-State Circuit, vol. 33, No. 12 pp. 2035-2041, Dec. 1998.

Sowlati et al., "High Density Capacitance Structures in Submicron CMOS for Low Power RF Applications", International Symposium on Low Power Electronics and Design, 2001, Aug. 6-7, 2001, pp. 243-246.

Wakayama et al., "A 30-MHz Low-Jitter High-Linearity CMOS Voltage-Controlled Oscillator", IEEE Journal of Solid-State Circuits, vol. sc-22, No. 6, Dec. 1987, pp. 1074-1081.

Bersuker, G. et al., Mechanism of Electron Trapping and Characteristics of Traps in $HfO_2$ Gate Stacks, IEEE Transactions on Device and Materials Reliability, vol. 7, No. 1, Mar. 2007, pp. 138-145.

Keane, J. et al., "An On-Chip NBTI Sensor for Measuring pMOS Threshold Voltage Degradation", IEEE Transactions on Very Large Scale Integration (VLSI) Systems, 1-10.

* cited by examiner

CAPACITOR STRUCTURE IN AN INTEGRATED CIRCUIT

BACKGROUND

Field of the Invention

Examples of the present disclosure generally relate to integrated circuits and, in particular, to capacitor structures in integrated circuits.

Description of the Related Art

Capacitors are used in integrated circuits (ICs) for a variety of purposes. Metal finger capacitors ("finger capacitors") are example capacitor structures used in ICs. An LC tank or resonator is one type of circuit integrated in an IC that can utilize a finger capacitor. At low frequencies, such as frequencies less than 10 Gigahertz (GHz), the inductor (L) is normally the dominant factor for LC tank performance, since the quality factor (Q) of the inductor is typically 2-3 times lower than the Q of the finger capacitor (C). For higher frequencies, such as frequencies greater than 30 GHz, the Q of the finger capacitor drops dramatically, becoming less than the Q of the inductor. For such higher frequencies, the Q of the finger capacitor becomes the dominant limiting factor. As technology scaling continues, achieving a higher Q in finger capacitors without increasing surface area required in the IC remains a challenge.

SUMMARY OF THE INVENTION

Capacitor structures in integrated circuits (ICs) are described. In an example implementation, a capacitor in an integrated circuit (IC), includes: a first finger capacitor formed in at least one layer of the IC having a first bus and a second bus; a second finger capacitor formed in the at least one layer of the IC having a first bus and a second bus, where a longitudinal edge of the second bus of the second finger capacitor is adjacent a longitudinal edge of the first bus of the first finger capacitor and separated by a dielectric gap; and a first metal segment formed on a first layer above the at least one layer, the first metal segment being electrically coupled to the first bus of the first finger capacitor and increasing a width and a height of the first bus of the first finger capacitor.

In another example implementation, an integrated circuit (IC), comprises: a substrate; at least one layer on the substrate including finger capacitors formed therein separated by dielectric gaps, each of the finger capacitors having a first bus and a second bus where: for each adjacent pair of the finger capacitors, a longitudinal edge of the first bus of a first finger capacitor is adjacent a longitudinal edge of the second bus of an adjacent finger capacitor separated by a respective one of the dielectric gaps; the first busses of the finger capacitors are electrically coupled to provide a first node of a capacitor, and the second busses of the finger capacitors are electrically coupled to provide a second node of a capacitor; and a first layer above the at least one layer having first metal segments formed therein, each of the first metal segments being electrically coupled to, and increasing a width and a height of, the first bus of a respective one of the finger capacitors.

In another example implementation, a method of forming a capacitor in an integrated circuit (IC), comprises: forming a first finger capacitor having first and second busses in at least one layer of the IC; forming a second finger capacitor having first and second busses in the at least one layer, a longitudinal edge of the second bus of the second finger capacitor being adjacent to a longitudinal edge of the first bus of the first finger capacitor separated by a dielectric gap; and forming a first metal segment on a first layer above the at least one layer of the IC, the first metal segment being electrically coupled to the first bus in the first finger capacitor, the first metal segment increasing a width and a height of the first bus of the first finger capacitor.

These and other aspects and features will be evident from reading the following Detailed Description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Capacitor structures in integrated circuits (ICs) are described. In an example implementation, finger capacitors are formed in at least one layer of an IC separated by dielectric gaps. Each finger capacitor includes a pair of busses coupled to interdigitated metal fingers. For example, the finger capacitors include first busses electrically coupled to provide a first node of a capacitor, and second busses electrically coupled to provide a second node of the capacitor. For a given adjacent pair of finger capacitors, a longitudinal edge of a first bus in a first finger capacitor is adjacent to a longitudinal edge of a second bus in an adjacent finger capacitor separated by a dielectric gap. Metal segments are formed in a first layer above the at least one layer of the IC and are electrically coupled to the first busses of the finger capacitors. The metal segments increase the widths and heights of the first busses. In an example, a metal segment overlaps at least a portion of a first bus and at least a portion of a dielectric gap. In another example, a metal segment overlaps at least a portion of a first bus and at least a portion of a second bus of an adjacent finger capacitor. In yet another example, a metal segment is coextensive with a first bus of a first finger capacitor, a dielectric gap, and a second bus of an adjacent finger capacitor.

In this manner, the width and height of the first bus in each finger capacitor is increased without increasing surface area of the finger capacitor in the IC. The increase in both width and height of the first bus reduces series resistance (e.g., parasitic resistance of the capacitor), which results in a higher quality factor (Q) for the capacitor. Also, since the metal segments are on another layer within the existing capacitor area, no additional surface area is used to improve Q of the capacitor.

In another example implementation, one or more additional layers can be formed over the first layer in the IC. Each additional layer can include a metal segment electrically coupled to the first metal segments in the first layer. Each metal segment formed in an additional layer above the first layer further increases the width and height of the first busses of the finger capacitors. In general, each metal segment formed in an additional layer above the first layer can overlap at least a portion of the area of the finger capacitors. In an example, each metal segment formed in an additional layer above the first layer can be coextensive with the area of the finger capacitors. In this manner, the width and height of the first bus in each finger capacitor is further increased without increasing surface area of the finger capacitor in the IC. The additional metal segment(s) provide for a further increase in Q for the capacitor. These and additional aspects of example capacitor structures can be understood with reference to the following drawings and description.

Figure 1:
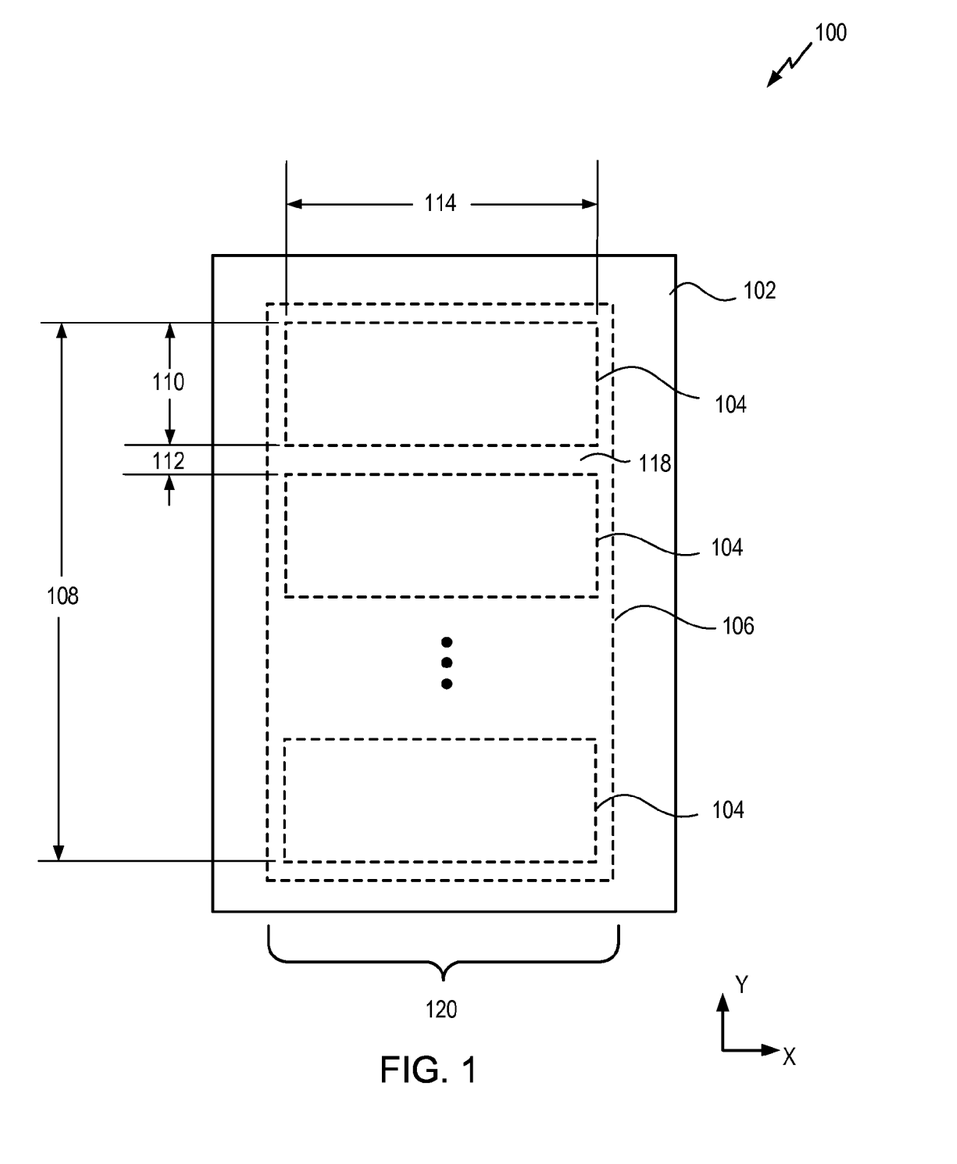
FIG. 1 is a top view depicting a portion of an IC according to an example implementation.

FIG. 1 is a top view depicting a portion of an IC 100 according to an example implementation. The IC 100 includes a substrate 102 and a plurality of capacitive structures that form a capacitor 120. The capacitive structures can include finger capacitors 104 formed using one or more layers of the IC (examples described below). Each of the finger capacitors 104 includes a width 110 along a first axis (designed as the "Y axis"), and a length 114 along a second axis (designated the "X axis"). While the finger capacitors 104 are generally shown as having a width being less than a length, it is to be understood that in some examples, the width is greater than or equal to the length. Thus, the terms "width" and "length", "latitudinal" and "longitudinal", and "thickness", "height" and "elevation" refer to direction for ease of reference and are not dimensional limitations. In the present example, the length or longitudinal direction is along the X-axis, and the width or latitudinal direction is along the Y-axis. In some drawings, a height, thickness, or elevation is along a Z-axis perpendicular to both the X- and Y-axes.

The finger capacitors 104 are separated by dielectric gaps 118 each having a width 112. No metal is formed in the layer(s) comprising the capacitive structures 104 within the volume defined by each of the gaps 118. Rather, the dielectric gaps 118 comprise dielectric material between metal portions of adjacent finger capacitors. The finger capacitors 104 collectively provide the capacitor 120 having a width 108 and the length 114. The capacitor 120 can be repeated in the IC to provide multiple such capacitors 120.

At least one additional layer (generally shown by 106) is disposed over the finger capacitors 104. The additional layer(s) 106 include metal segments (examples described below) that extend both a width and a height of busses (described below) in the capacitive structures 104. The increased width and height of the busses decreases series resistance of the capacitor 120 and increases Q for the capacitor 120. Since the metal segments are formed on layer(s) above the finger capacitors 104, the metal segments do not increase the surface area or footprint of the capacitor 120 in the x-y plane of the substrate 102.

Figure 2:
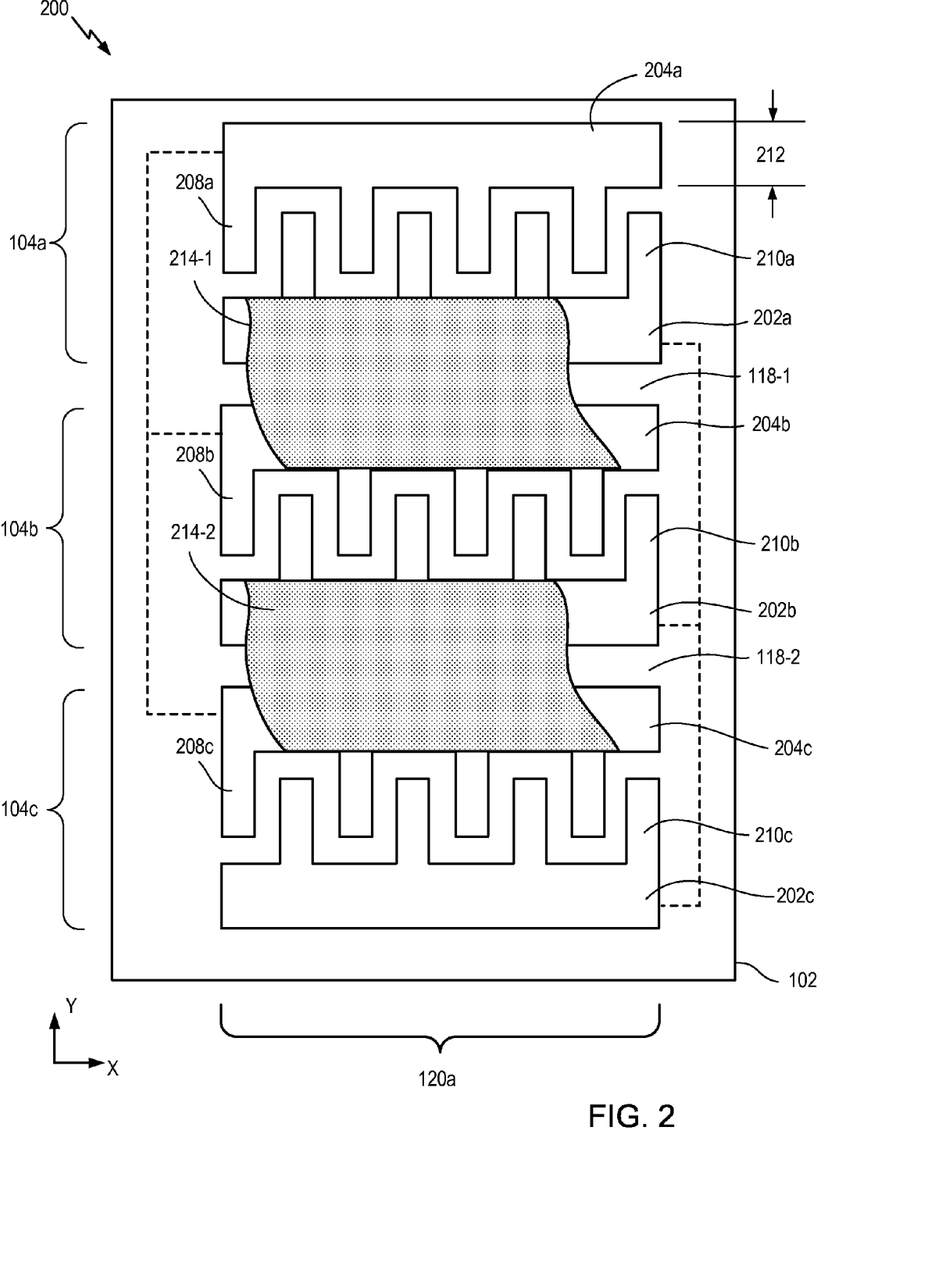
FIG. 2 is a top view of a capacitor according to an example implementation.

FIG. 2 is a top view of a capacitor 120a according to an example implementation. The capacitor 120a is an implementation of the capacitor 120 having three finger capacitors 104a, 104b, and 104c. In general, the finger capacitors 104 each include a first bus, a second bus, first fingers electrically coupled to the first bus, and second fingers electrically coupled to the second bus and interdigitated with the first fingers. Thus, the finger capacitor 104a includes a first bus ("bus 202a"), a second bus ("bus 204a"), first fingers ("fingers 208a"), and second fingers ("fingers 210a"). The finger capacitor 104b includes a first bus ("bus 202b"), a second bus ("bus 204b"), first fingers ("fingers 208b"), and second fingers ("fingers 210b"). The finger capacitor 104c includes a first bus ("bus 202c"), a second bus ("bus 204c"), first fingers ("fingers 208c"), and second fingers ("fingers 210c"). The busses 202a through 202c and 204a through 204c are collectively referred to as busses 202 and busses 204, respectively. Likewise, the fingers 208a through 208c and the fingers 210a through 210c are collectively referred to as fingers 208 and fingers 210, respectively. The busses 202, 204 each have a width 212. In the example, the busses 202, 204 are shown having the same width, but in other examples some of the busses 202, 204 can have a greater width than other of the busses 202, 204. In addition, by way of example, each of the finger capacitors 104 is shown as having four fingers 208 and four fingers 210. The capacitive structures 104 can generally include any number of fingers 208 and 210.

The finger capacitors 104 are disposed on the substrate 102 such that a longitudinal edge of the first bus in a one capacitive structure is adjacent a longitudinal edge of the second bus in an adjacent capacitive structure and separated by a dielectric gap. In the example, a longitudinal edge of the bus 202a is adjacent a longitudinal edge of the bus 204b, and the longitudinal edge of the bus 202b is adjacent a longitudinal edge of the bus 204c. A dielectric gap 118-1 separates the busses 202a and 204b, and a dielectric gap 118-2 separates the busses 202b and 204c. While the dielectric gaps 118 are shown generally as having equal widths, in other examples some gaps between capacitive structures can have greater width than other gaps.

In an example, the first busses of the finger capacitors 104 can be electrically coupled to provide a first node of the capacitor 120a, and the second busses of the finger capacitors 104 can be electrically coupled to provide a second node of the capacitor 120a. The conductors electrically coupling the first busses and electrically coupling the second busses are represented by dashed lines in FIG. 2 and can be formed in any layer on the substrate 102.

Metal segments 214-1 and 214-2 are formed on a layer above the layer(s) having the finger capacitors 104a through 104c. In FIG. 2, portions of the metal segments 214-1 and 214-2 are cut-away to reveal details below. In general, metal segments 214 formed above the capacitive structures 104 are each electrically coupled to, and increase width and height of, a first bus in one capacitive structure. In the example, the metal segment 214-1 is electrically coupled to the bus 202a, and the metal segment 214-2 is electrically coupled to the bus 202b. In the present example, the metal segment 214-1 is coextensive with the bus 202a, the gap 118-1, and the bus 204b. The metal segment 214-2 is coextensive with the bus 202b, the gap 118-2, and the bus 204c. The term "coextensive", as used herein, means to extend over the same area, and is meant to include substantially coextensive or approximately coextensive within tolerances of IC fabrication technology. In other examples, the metal segments 214-1 and 214-2 can extend over less than the total area of a first bus, a gap, and a second bus, as described below with respect to FIG. 3.

Figure 3:
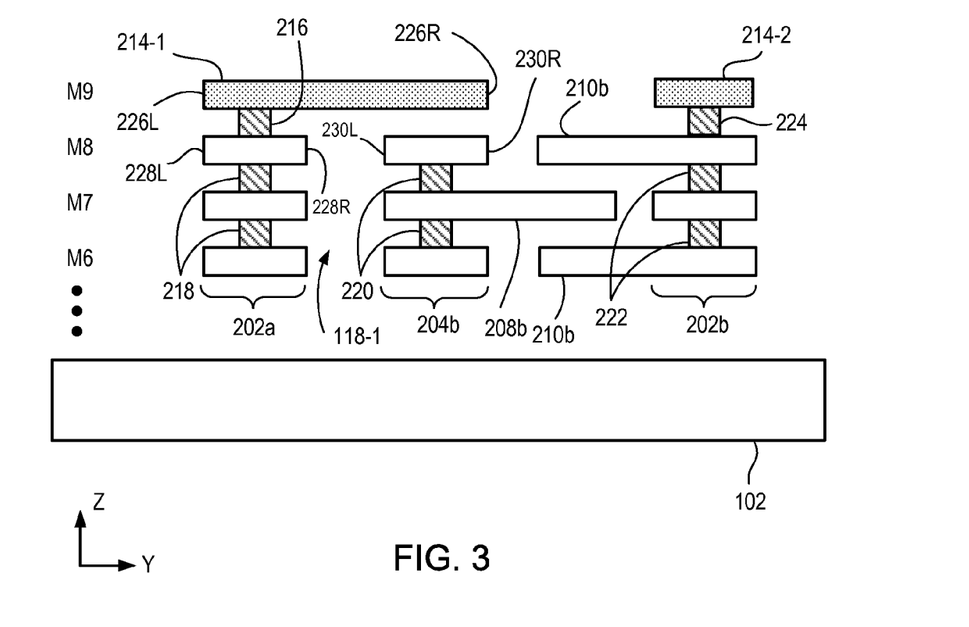
FIG. 3 is a partial cross-section of the capacitor of FIG. 2 according to an example implementation.
Figure 4:
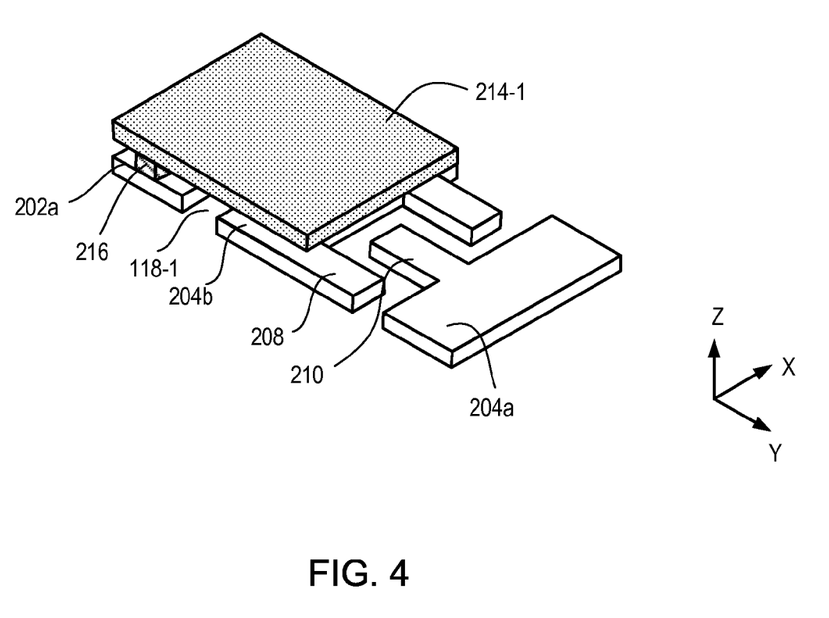
FIG. 4 is a partial isometric view of the capacitor of FIG. 2 according to an example implementation.

FIG. 3 is a partial cross-section of the capacitor 120a according to an example implementation. FIG. 4 is a partial isometric view of the capacitor 120a according to an example implementation. The partial cross-section in FIG. 3 shows a portion of the capacitor 120a in the Y-Z plane. The partial isometric view in FIG. 4 shows a portion of the capacitor 120a in the X-Y-Z space. The partial cross-section in FIG. 3 shows the bus 202a, the bus 204b, and the bus 202b. In the example, the busses 202a, 204b, and 202b are formed using three layers on the substrate 102, designated M6, M7, and M8. That is, the busses of the finger capacitors 104 can be formed in the sixth, seventh, and eighth metal layers on the substrate 102. Other layers can be formed below the capacitor 120a, such as other metal layers and/or polysilicon layers, which can be used for other purposes. For purposes of clarity by example, dielectric layers between the metal layers are omitted from FIGS. 3 and 4. While the finger capacitors 104 are shown as having three layers, in general the finger capacitors 104 can be formed in at least one layer. Further, while layers M6, M7, and M8 are shown as an example, the finger capacitors 104 can be formed in any layers of a layer stack on the substrate 102.

The bus 202a includes portions on layers M6, M7, and M8 electrically coupled by vias 218. The bus 204b includes portions on layers M6, M7, and M8 electrically coupled by vias 220. The bus 202b includes portions on layers M6, M7, and M8 electrically coupled by vias 222. The bus 202a includes a left longitudinal edge 228L and a right longitudinal edge 228R. The bus 202b includes a left longitudinal edge 230L and a right longitudinal edge 230R. The right longitudinal edge 228R of the bus 202a is adjacent to the left longitudinal edge 230L of the bus 202b separated by the dielectric gap 118-1.

The fingers 210b include segments on the layer M8 and the layer M6. The fingers 208b include segments on the layer M7. In general, the fingers 208b and 210b can be formed on any of the layers M6-M8 in an interdigitated fashion. Fingers 208 and 210 of other capacitive structures 104 can be configured similarly.

The metal segment 214-1 is formed in a layer M9 above the layer M8 and is electrically coupled to the bus 202a by vias 216. Likewise, the metal segment 214-2 is formed in the layer M9 and is electrically coupled to the bus 202b by vias 224. The metal segment 214-1 overlaps the bus 202a, the bus 204b, and the gap 118-1 between the bus 202a and 204b. In the example, the metal segment 214-1 is shown as being coextensive with the bus 202a, the gap 118-1, and the bus 204b. That is, a left longitudinal edge 226L of the metal segment 214-1 is aligned with the left longitudinal edge 228L of the bus 202a, and a right longitudinal edge 226R of the metal segment 214-1 is aligned with a right longitudinal edge 230R of the bus 204b. The parasitic capacitance between the metal segment 214-1 and the substrate 102 or other metal layers on the substrate 102 through the dielectric gap 118-1 is small and can be ignored in most applications. By being coextensive with the bus 202a, the dielectric gap 118-1, and the bus 204b, the metal segment 214-1 provides largest decrease in series resistance and adds the least parasitic capacitance. The term "aligned" is meant to encompass substantially aligned or approximately aligned within tolerances of IC fabrication technology.

Other configurations are possible depending on design specifications and fabrication constraints. For example, the metal segment 214-1 can overlap all or a portion of the bus 202a, all or a portion of the dielectric gap 118-1, or all or a portion of the bus 204b. In general, the left longitudinal edge 226L of the metal segment 214-1 can be aligned with the left longitudinal edge 228L of the bus 202a, or can be offset either to the left or the right of the left longitudinal edge 228L of the bus 202a. The right longitudinal edge 226R of the metal segment 214-1 can be aligned with the left longitudinal edge 230L of the bus 204b, or can be offset either to the left or the right of the left longitudinal edge 230L of the bus 204b. Other metal segments on the layer M9 can be configured similar to the metal segment 214-1.

Figure 5:
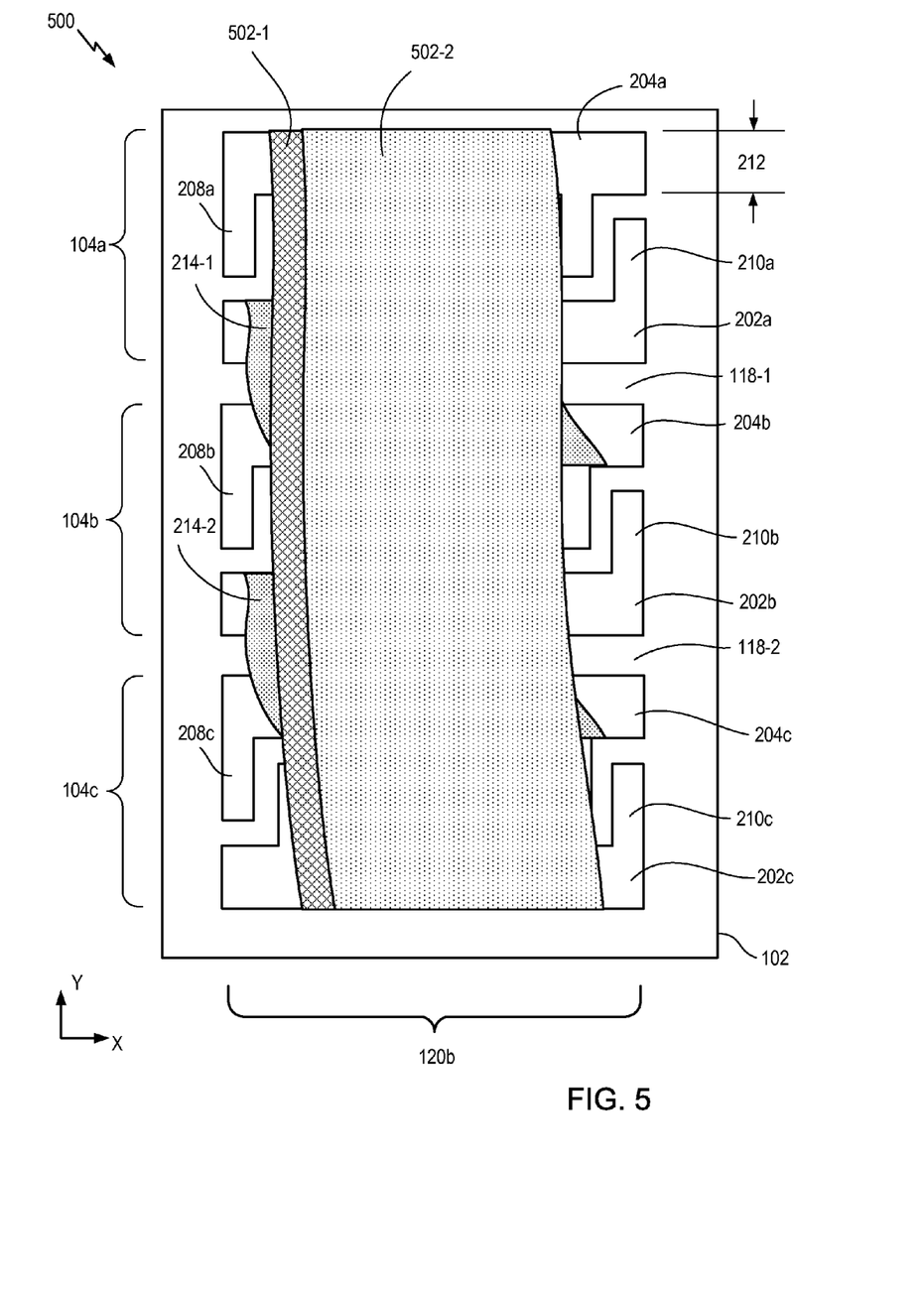
FIG. 5 is a top view of a capacitor according to another example implementation.

FIG. 5 is a top view of a capacitor 120b according to another example implementation. The capacitor 120b comprises another implementation of the capacitor 120. The capacitor 120b can include at least one metal segment formed in at least one layer above the metal segments 214-1 and 214-2. In the present example, the capacitor 120b includes metal segments 502-1 and 502-2 formed in two layers above the layer having the metal segments 214-1 and 214-2. The metal segments 502-1 and 502-2 overlap the area of the finger capacitors 104. In an example, the metal segments 502-1 and 502-2 are coextensive with at least the finger capacitors 104 (e.g., the metal segments 502-1 and 502-2 are shown as being at least as coextensive as the finger capacitors 104a through 104c).

Figure 6:
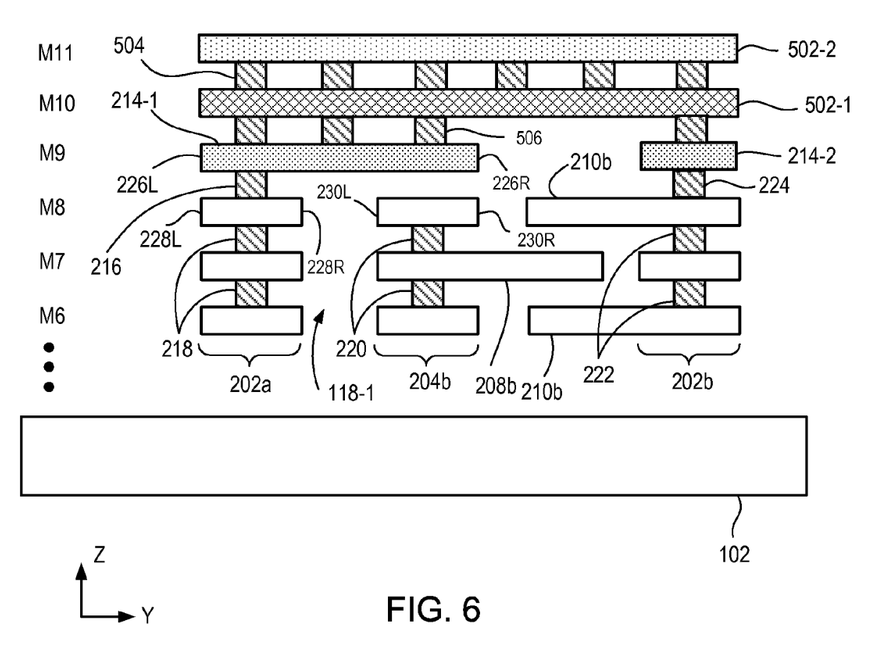
FIG. 6 is a partial cross-section of the capacitor of FIG. 5 according to an example implementation.
Figure 7:
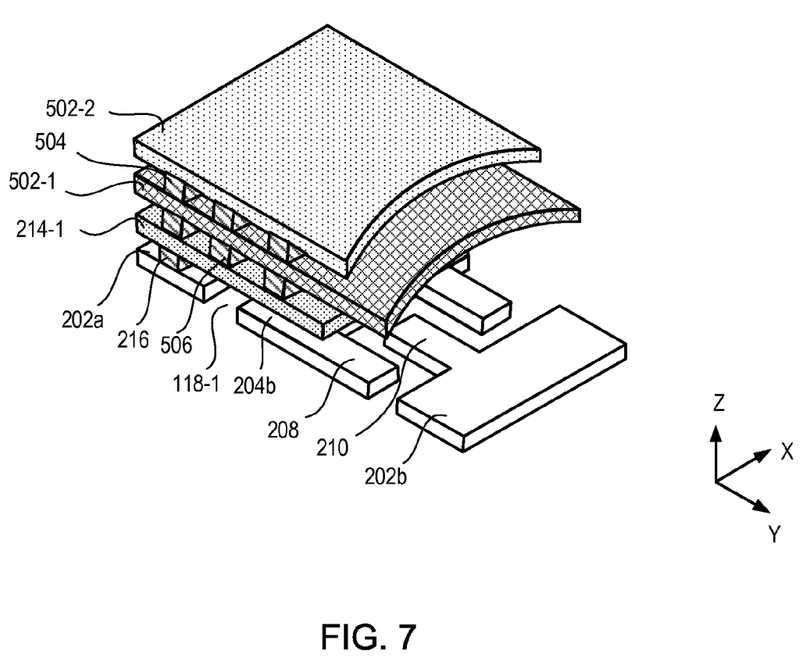
FIG. 7 is a partial isometric view of the capacitor of FIG. 5 according to an example implementation.

FIG. 6 is a partial cross-section of the capacitor 120b according to an example implementation. FIG. 7 is a partial isometric view of the capacitor 120b according to an example implementation. The partial cross-section of FIG. 6 shows a portion of the capacitor 120b in the Y-Z plane. The partial isometric view of FIG. 7 shows a portion of the capacitor 120b in the X-Y-Z space. The partial cross-section of FIG. 6 shows the metal segments 502-1 and 502-2 on layers M10 and M11 above the metal segments 214-1 and 214-2. The metal segment 502-1 is electrically coupled to the metal segments 214-1 and 214-2 by vias 506. The metal segment 502-2 is electrically coupled to the metal segment 502-1 by vias 504. The metal segments 502 can be formed in other layers depending on which layers are used to form the finger capacitors 104.

Figure 8:
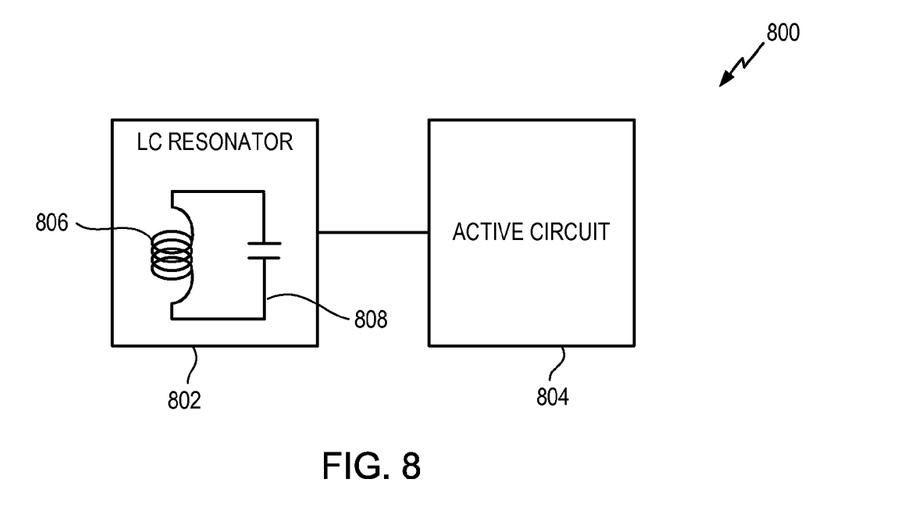
FIG. 8 is a block diagram of an example circuit employing a capacitor that can be formed according to the capacitor structures described herein.

FIG. 8 is a block diagram of an example circuit 800 employing a capacitor that can be formed according to the capacitor structures described herein. The circuit 800 includes an LC resonator 802 coupled to an active circuit 804. For example, the circuit 800 can be a voltage controlled oscillator (VCO). The LC resonator 802 includes an inductor (L) 806 and a capacitor (C) 808. As noted above, for high frequencies (e.g., 30 GHz or above), the Q of the capacitor 808 becomes the dominant limiting factor for performance of the resonator 802. The capacitor 808 can be formed according to any of the structures described herein that reduce series resistance, and hence increase Q.

Figure 9:
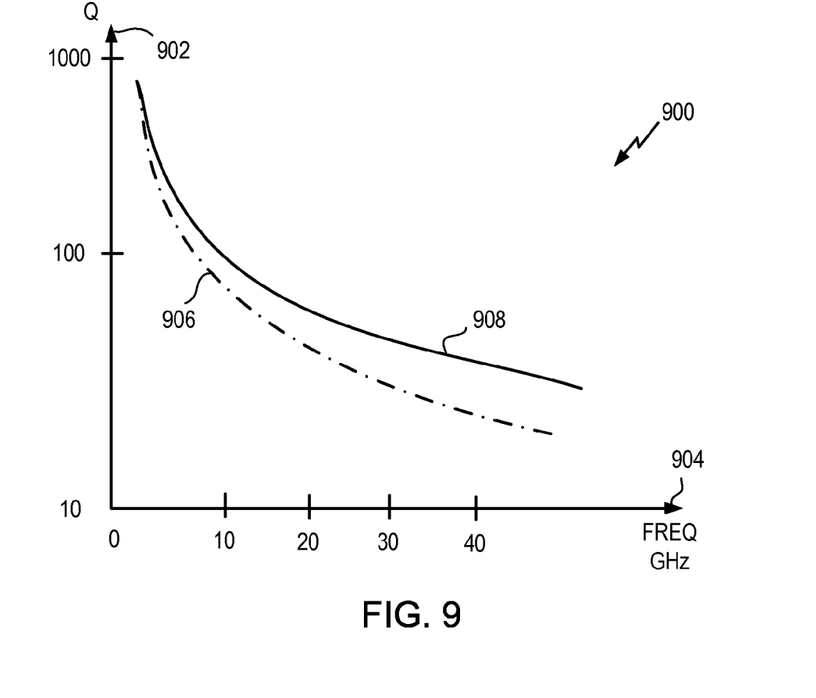
FIG. 9 is a graph depicting capacitive structure performance according to an example implementation.

FIG. 9 is a graph 900 depicting capacitive structure performance according to an example implementation. An axis 902 represents Q on a logarithmic scale, and an axis 904 represents frequency on a linear scale. A curve 906 shows Q versus frequency for a typical metal finger capacitor. A curve 908 shows Q versus frequency for a capacitor formed according to examples herein. As frequency increases, the improvement in finger capacitor Q as between a typical metal finger capacitor and a capacitor formed according to examples herein increases. For example, at 20 GHz, there is a 20% improvement in Q; at 30 GHz there is a 26% improvement in Q; and at 40 GHz there is a 28% improvement in Q. The graph 900 is merely an example, and the improvement in Q can depend on various factors and which the various example implementations described herein is employed. In general, the increased width and height of the bus results in lower series resistance, and hence a higher Q.

Figure 10:
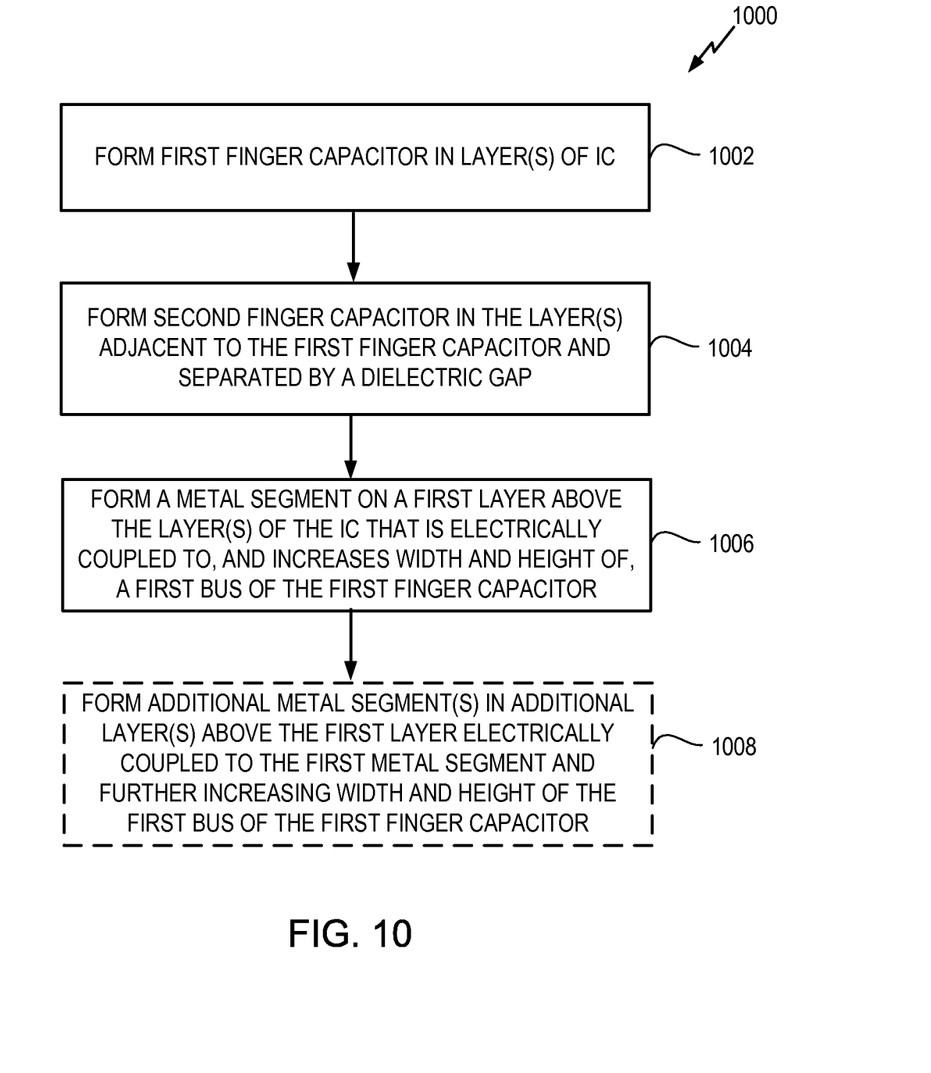
FIG. 10 is a flow diagram depicting a method of forming a capacitor in an IC according to an example implementation.

FIG. 10 is a flow diagram depicting a method 1000 of forming a capacitor in an IC according to an example implementation. The method 1000 begins at step 1002, where a first finger capacitor is formed in at least one layer of the IC. At step 1004, a second finger capacitor is formed in the layer(s) of the IC adjacent to the first finger capacitor and separated by a dielectric gap. The first and second finger capacitors each include first and second busses. A longitudinal edge of the first bus of the first finger capacitor is adjacent to a longitudinal edge of the second bus of the second finger capacitor and separated by the dielectric gap. At step 1006, a metal segment is formed on a first layer above the layer(s) of the IC having the finger capacitors. The metal segment is electrically coupled to, and increases width and height of, the first bus of the first finger capacitor. At an optional step 1008, one or more additional metal segments are formed on one or more additional layers of the IC above the first layer. The additional metal segment(s) are electrically coupled to the first metal segment and further increase width and height of the first bus. The steps of method 1000 can be performed using known IC fabrication techniques for depositing metal and dielectric layers on a semiconductor substrate. While the method 1000 relates to forming a pair of finger capacitors, the method 1000 can be performed to form multiple adjacent pairs of finger capacitors having the same structure.

While the foregoing is directed to specific examples, other and further examples may be devised without departing from the basic scope thereof, and the scope thereof is determined by the claims that follow.

What is claimed is:

1. A capacitor in an integrated circuit (IC), comprising:
   a first finger capacitor formed in at least one layer of the IC having a first bus, a second bus, first fingers, and second fingers, the first fingers of the first finger capacitor electrically coupled to the first bus of the first finger capacitor and interdigitated with the second fingers of the first finger capacitor, which are electrically coupled to the second bus of the first finger capacitor;
   a second finger capacitor formed in the at least one layer of the IC having a first bus, a second bus, first fingers, and second fingers, the first fingers of the second finger capacitor electrically coupled to the first bus of the second finger capacitor and interdigitated with the second fingers of the second finger capacitor, which are electrically coupled to the second bus of the second finger capacitor, where a longitudinal edge of the second bus of the second finger capacitor is adjacent a longitudinal edge of the first bus of the first finger capacitor and separated by a dielectric gap;
   a first metal segment formed on a first layer above the at least one layer and overlapping at least a portion of the dielectric gap, the first metal segment being electrically coupled to the first bus of the first finger capacitor and increasing a width and a height of the first bus of the first finger capacitor; and
   a second metal segment above the at least one layer of the IC, the second metal segment laterally spaced apart from the first metal segment, the second metal segment being electrically coupled to the first bus of the second finger capacitor and increasing a width and a height of the first bus of the second finger capacitor.

2. The capacitor of claim 1, wherein the first metal segment is coextensive with the first bus of the first finger capacitor, the dielectric gap, and the second bus of the second finger capacitor.

3. The capacitor of claim 1, further comprising:
   vias electrically coupling the first metal segment with the first bus of the first finger capacitor.

4. The capacitor of claim 1, further comprising:
   at least one additional metal segment formed on at least one additional layer above the first layer, each of the at least one additional metal segment being electrically coupled to the first metal segment, each of the at least one additional metal segment further increasing the width and the height of the first bus of the first finger capacitor.

5. The capacitor of claim 4, wherein each of the at least one metal segment is coextensive with at least the first and second finger capacitors.

6. The capacitor of claim 4, wherein the at least one additional metal segment comprises a metal segment coupled by vias to the first metal segment.

7. The capacitor of claim 1, wherein the first busses of the first and second finger capacitors are electrically coupled to provide a first node of a capacitor, and the second busses of the first and second finger capacitors are electrically coupled to provide a second node of a capacitor.

8. An integrated circuit (IC), comprising:
   a substrate;
   at least one layer on the substrate including finger capacitors formed therein separated by dielectric gaps, each of the finger capacitors having a first bus, a second bus, first fingers, and second fingers where:
      for each of the finger capacitors, the first fingers are electrically coupled to the first bus and interdigitated with the second fingers, which are electrically coupled to the second bus;
      for each adjacent pair of the finger capacitors, a longitudinal edge of the first bus of a first finger capacitor is adjacent a longitudinal edge of the second bus of an adjacent finger capacitor separated by a respective one of the dielectric gaps;
      the first busses of the finger capacitors are electrically coupled to provide a first node of a capacitor, and the second busses of the finger capacitors are electrically coupled to provide a second node of a capacitor; and
   a first layer above the at least one layer having first metal segments formed therein, each of the first metal segments being electrically coupled to, and increasing a width and a height of, the first bus of a respective one of the finger capacitors while overlapping the second bus of an adjacent finger capacitor.

9. The IC of claim 8, wherein each of the first metal segments overlaps at least a portion of a respective one of the dielectric gaps.

10. The IC of claim 9, wherein for each adjacent pair of the finger capacitors, a respective one of the first metal segments is coextensive with the first bus of a first finger capacitor, a respective one of the dielectric gaps, and the second bus of an adjacent finger capacitor.

11. The IC of claim 8, further comprising:
    vias electrically coupling each of the first metal segments to the first bus of a respective one of the finger capacitors.

12. The IC of claim 8, further comprising:

at least one additional layer above the first layer including a respective at least one additional metal segment, each of the at least one additional metal segment being electrically coupled to the first metal segments, each of the at least one additional metal segment further increasing the width and the height of the first bus of each of the finger capacitors.

13. The IC of claim 12, where each of the at least one additional metal segment is coextensive with the finger capacitors.

14. The IC of claim 12, wherein the at least one additional metal segment comprises a second metal segment, and wherein the IC further comprises:

vias electrically coupling the second metal segment to the first metal segments.

\* \* \* \* \*